United States Patent
Parthasarathy et al.

(10) Patent No.: US 10,498,367 B2
(45) Date of Patent: *Dec. 3, 2019

(54) PROGRESSIVE EFFORT DECODER ARCHITECTURE

(71) Applicant: MICRON TECHNOLOGY, INC., Boise, ID (US)

(72) Inventors: Sivagnanam Parthasarathy, Carlsbad, CA (US); Nicholas Julian Richardson, San Diego, CA (US); Patrick Robert Khayat, San Diego, CA (US); Mustafa Nazmi Kaynak, San Diego, CA (US); Ka Leung Ling, San Jose, CA (US); Robert B. Eisenhuth, Boulder, CO (US)

(73) Assignee: Micron Technology, Inc., Boise, ID (US)

( * ) Notice: Subject to any disclaimer, the term of this patent is extended or adjusted under 35 U.S.C. 154(b) by 126 days.

This patent is subject to a terminal disclaimer.

(21) Appl. No.: 15/491,705

(22) Filed: Apr. 19, 2017

(65) Prior Publication Data
US 2017/0222663 A1  Aug. 3, 2017

Related U.S. Application Data

(63) Continuation of application No. 14/502,513, filed on Sep. 30, 2014, now Pat. No. 9,654,144.

(51) Int. Cl.
H03M 13/29 (2006.01)
H03M 13/15 (2006.01)
H03M 13/11 (2006.01)
H03M 13/37 (2006.01)

(52) U.S. Cl.
CPC .... *H03M 13/2927* (2013.01); *H03M 13/1111* (2013.01); *H03M 13/152* (2013.01); *H03M 13/2906* (2013.01); *H03M 13/3715* (2013.01)

(58) Field of Classification Search
CPC ... H03M 13/15; H03M 13/35; H03M 13/3707
See application file for complete search history.

(56) References Cited

U.S. PATENT DOCUMENTS

| | | | |
|---|---|---|---|
| 5,844,507 A | 12/1998 | Zook | |
| 6,182,264 B1 | 1/2001 | Ott | |
| 8,555,131 B2 | 10/2013 | Rault et al. | |
| 8,621,318 B1 | 12/2013 | Micheloni et al. | |
| 9,654,144 B2 * | 5/2017 | Parthasarathy | H03M 13/152 |

(Continued)

FOREIGN PATENT DOCUMENTS

CN  101472184  12/2010

*Primary Examiner* — Guy J Lamarre
(74) *Attorney, Agent, or Firm* — Fletcher Yoder, P.C.

(57) ABSTRACT

A memory device may include memory components to store data. The memory device may also include a processor that may decode a codeword associated with the data. The processor may receive the codeword and determine whether the codeword is independently decodable using a BCH decoder. The processor may then decode the codeword using the BCH decoder when the codeword is determined to be independently decodable using the BCH decoder. Otherwise, the processor may decode the codeword using a second decoder and the BCH decoder when the codeword is not determined to be independently decodable using the BCH decoder.

20 Claims, 4 Drawing Sheets

(56) References Cited

U.S. PATENT DOCUMENTS

| | | |
|---|---|---|
| 2004/0078747 A1 | 4/2004 | Miller et al. |
| 2007/0011564 A1 | 1/2007 | Kons et al. |
| 2011/0264981 A1 | 10/2011 | Alrod et al. |
| 2012/0060071 A1 | 3/2012 | Shin et al. |
| 2013/0091397 A1 | 4/2013 | Kia et al. |
| 2013/0132804 A1 | 5/2013 | Frayer et al. |

* cited by examiner

PROGRESSIVE EFFORT DECODER ARCHITECTURE

CROSS-REFERENCE TO RELATED APPLICATION

This application a continuation of U.S. patent application Ser. No. 14/502,513, entitled "Progressive Effort Decoder Architecture," and filed Sep. 30, 2014, the entirety of which is incorporated by reference herein for all purposes.

BACKGROUND

1. Field of the Invention

The present disclosure relates generally to detecting and correcting errors associated with data stored in memory devices. In particular, the present disclosure is related to improving the energy efficiency associated with decoding codewords expected to have varying amounts of errors.

2. Description of the Related Art

To write data within a memory component, such as a NAND memory cell, of a memory device, the memory device generally employs a program/erase (P/E) cycle to write the data. The P/E cycle generally involves erasing existing data that is currently stored in the memory component and then writing new data into the respective memory component. Although these memory devices may store and access data in a timely manner, the integrity of the data stored in the devices may become less reliable after executing a certain number of P/E cycles. That is, each P/E cycle may cause a small amount of physical damage to the medium (e.g., memory component) used to store the data. As such, the memory device may have a limited number of P/E cycles before the data stored on a respective device is unreliable.

The reliability of the memory device may be quantified by raw bit error rates (RBERs). Since memory devices increasingly employ small memory cell geometries, which may have severe noise and disturb mechanisms, the end-of-life RBERs of the memory devices are relatively large as compared to the beginning-of-life RBERs of the respective memory devices. To ensure that the data read from the memory cells are error-free, the memory device may use powerful error correction codes (ECCs) to correct errors that may exist. Although the powerful ECCs may correct bit errors in the data, using powerful ECCs throughout the life of the memory device may be an inefficient way to detect and correct the errors in the data. Accordingly, improved methods for detecting and correcting errors in data stored in various types of memory devices are desirable.

DETAILED DESCRIPTION OF SPECIFIC EMBODIMENTS

As memory cell geometries become smaller and data is repeatedly written and erased in a memory device, such as a flash memory, the memory device may be more susceptible to errors due to various types of noise and disturb mechanisms inherent within the memory cell, which may be exacerbated with repeated programming. As a result, the raw bit error rates (RBERs) for the memory device become larger over time. Given this pattern, the end-of-life RBERs for these devices are much higher as compared to the beginning-of-life RBERs for the respective devices. To ensure that the data read from the memory device is error-free, a processor may use powerful error correction codes (ECCs), such as low density parity check (LDPC) codes, to correct errors and verify that the data written into the memory device is the same as the data being read from the respective memory device.

Although ECCs such as LDPC codes are capable of detecting and correcting large number of errors that correspond to the end-of-life stage of memory devices, the use of these types of codes are costly in terms of hardware implementation as well as power consumption. In this manner, the hardware costs of the respective memory device increase and the battery life of the respective memory device decreases, as more powerful ECCs are employed by the respective memory device.

Keeping the foregoing in mind and recalling that the beginning-of-life or initial life RBERs of a memory device are relatively low as compared to the corresponding end-of-life RBERs, a processor may implement a progressive effort guide (PEG) decoder algorithm for implementing various types of ECC decode modes throughout the life of the memory device. That is, in one embodiment, the processor may use one type of ECC decode mode that is less powerful than other ECC decode modes, such as the decode mode corresponding to LDPC codes, during the initial life of the memory device. As the RBERs for the respective memory device increase over time, the PEG decoder algorithm may indicate to the processor that a more powerful ECC decode mode should be used to ensure that the codeword being decoded is error-free. By varying the type of ECC decode mode used to decode the codeword over time, the processor may significantly improve the power and energy efficiency of the memory device.

Figure 1:
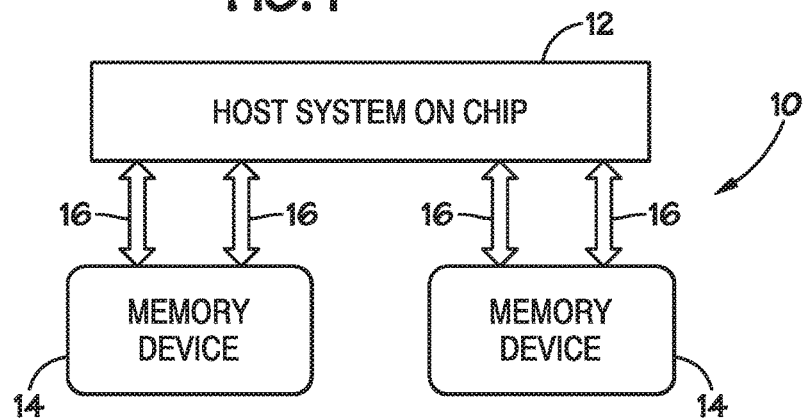
FIG. 1 illustrates a block diagram of an example of a computing system, in accordance with an embodiment.

By way of introduction, FIG. 1 illustrates a block diagram of a computing system 10 that may employ various techniques and systems described herein. The computing system 10 may be any of a variety of computing devices, such as a computer, a pager, a cellular phone, a personal organizer, a control circuit, and the like. The computing system 10 may include a host system on chip (SoC) 12 that may be coupled to a number of memory devices 14. The host SoC 12 may be an integrated circuit (IC) that integrates certain components of a computer or other electronic system into a single chip. As such, the host SoC 12 may include one or more processors, such as a microprocessor, that may control the processing of system functions and requests in the computing system 10.

As mentioned above, the host SoC 12 may be coupled to the memory devices 14. In certain embodiments, the host SoC 12 may be coupled to the memory devices 14 via channels 16. The channels 16 may include buses, electrical wiring, or the like.

Figure 2:
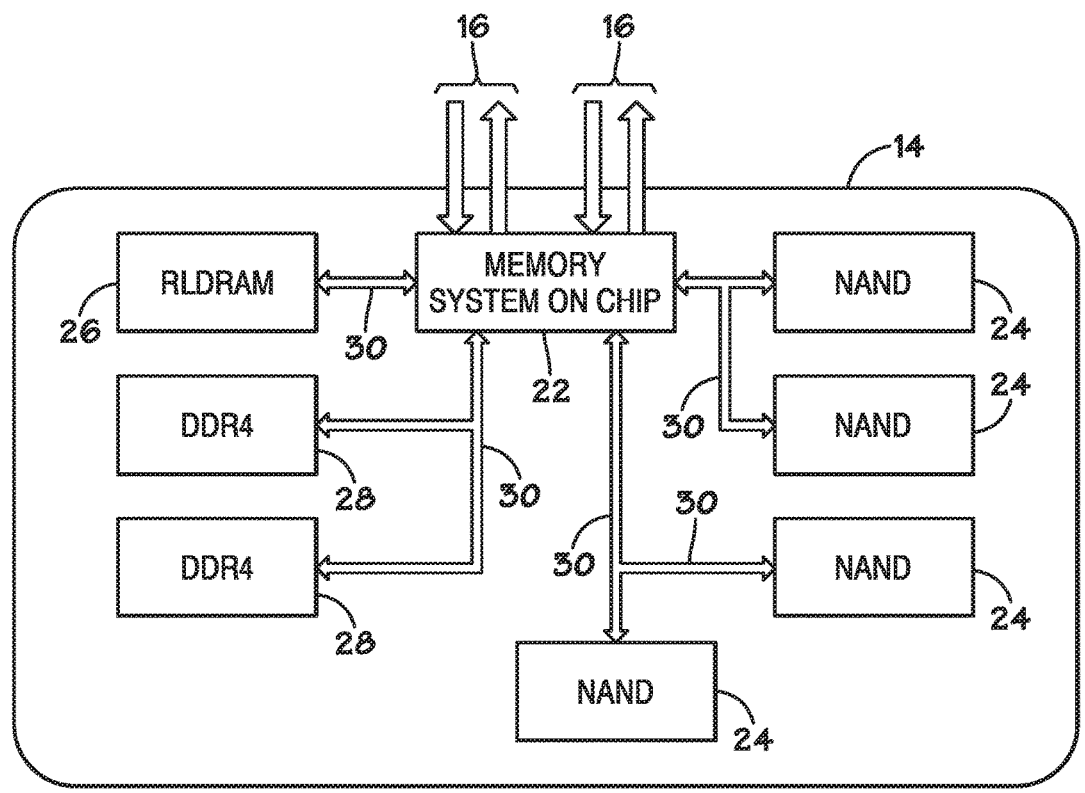
FIG. 2 illustrates a block diagram of an example of a memory device which may be part of the computing system of FIG. 1, in accordance with an embodiment.

FIG. 2 depicts a block diagram of an embodiment of the memory device 14. The memory device 14 may include any electrical storage device designed to retain digital data. The memory device 14 may encompass a wide variety of memory components including volatile memory and non-volatile memory. Volatile memory may include Dynamic Random Access Memory (DRAM) and/or Static Random Access Memory (SRAM). Moreover, the volatile memory may include a number of memory modules, such as single inline memory modules (SIMMs) or dual inline memory modules (DIMMs).

The non-volatile memory may include a read-only memory (ROM), such as an EPROM, and/or flash memory (e.g., NAND) to be used in conjunction with the volatile memory. Additionally, the non-volatile memory may include a high capacity memory such as a tape or disk drive memory. As will be appreciated, the volatile memory or the non-volatile memory may be considered a non-transitory tangible machine-readable medium for storing code (e.g., instructions).

As shown in FIG. 2, in certain embodiments, the memory device 14 may include a memory system on chip (SoC) 22 that may be a processor-in-memory (PIM) or a computer processor (CPU) tightly coupled to the memory components stored on the memory device 14. Generally, the memory SoC 22 may be on the same silicon chip as the memory components of the memory device 14. By merging the processing and memory components into the memory device 14, the memory SoC 22 may manage the manner in which data requests and responses are transmitted and received between the memory components and the host SoC 12. In certain embodiments, the memory SoC 22 may control the traffic between the memory components to reduce latency and increase bandwidth.

By way of example, the memory device 14 may include memory types such as NAND memories 24, Reduced-latency Dynamic random access memory (RLDRAM) 26, double data rate fourth generation synchronous dynamic random-access memory (DDR4) 28, and the like. Each of these memory types may be communicatively coupled to the memory SoC 22 via channels 30, which may include electrical channels, optical channels, buses, and the like.

As will be appreciated, the host SoC 12 or the memory SoC 22 may employ a progressive effort guide (PEG) decoder algorithm or scheme, as discussed above, to increase the power used for correcting errors in data as the number of program/erase (P/E) cycles performed by the memory device 14 increase over time. For example, FIG. 3 illustrates a graph 40 of example of average RBERs as a function of P/E cycles for four different types of memory devices.

Figure 3:
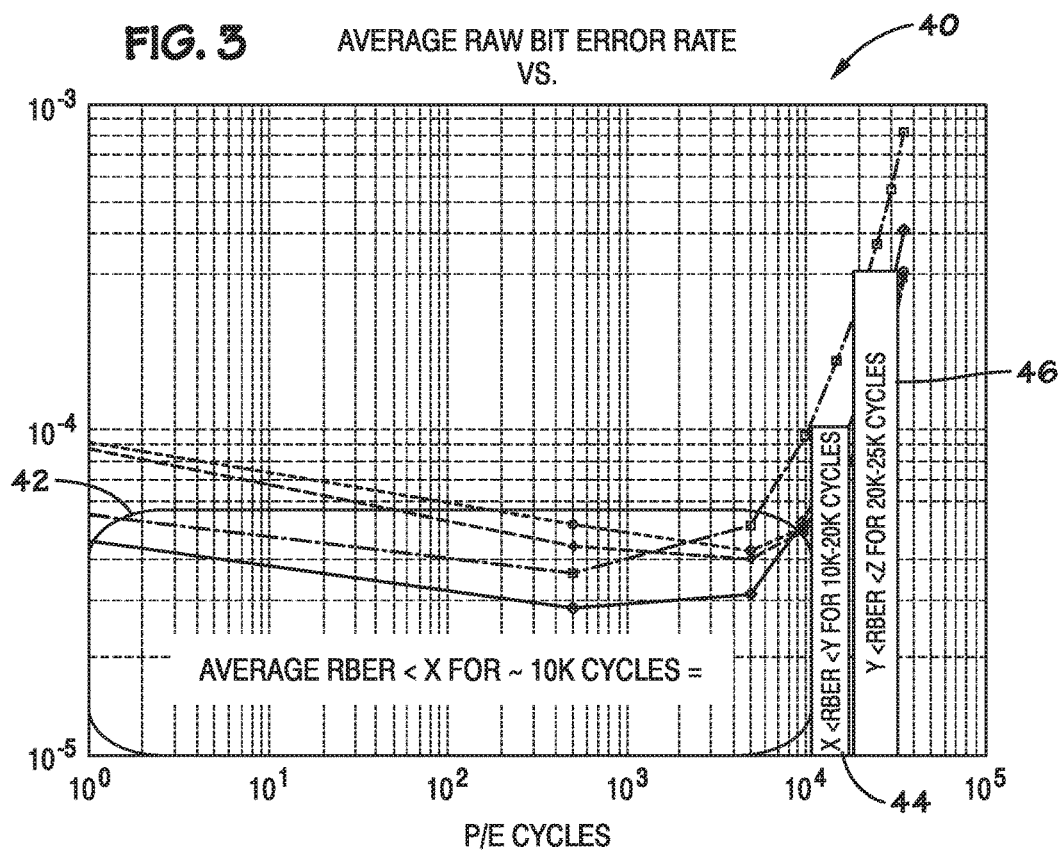
FIG. 3 illustrates a graph of raw bit error rates (RBERs) as a function of P/E cycles for four different example memory devices, in accordance with an embodiment.

As shown in FIG. 3, the average RBERs for the different types of memory devices remain relatively stable for an initial number of P/E cycles (e.g., approximately 10,000 cycles for a particular flash memory device). This initial P/E cycle period 42 may be characterized as having an average RBER less than some low value X (e.g., 3e-4 to 6e-4). The average RBER or the mean of the RBER represents the average condition of the memory device. As such, as the RBER value associated with the memory device increases, the reliability of the data stored in the memory device decreases.

As the memory devices perform more P/E cycles and the average RBER of the memory devices surpass the low value X, the memory devices enter a mid-level P/E cycle period 44 that follows the initial P/E cycle period 42. In the mid-level P/E cycle period 44, the average RBER exceeds the low value X and is below some middle value Y (e.g., 8e-4 to 2e-3). As such, the memory devices begin to experience a higher average RBER as compared to the initial P/E cycles due to the number of P/E cycles they have performed.

Continuing this trend, as the memory devices perform even more P/E cycles, the memory devices enter a high-level P/E cycle period 46. Here, the average RBER exceeds the middle value Y and is below some high value Z (e.g., 3e-3 to 5e-3). The RBER distribution over the life of each memory device is characterized by a long and slim tail that corresponds to deviations from the average behavior. These deviations may be less pronounced during the initial period of the life of the memory device as compared to the end-of-life period of the respective memory device. These deviations may be due to a number of factors, such as retention events, read disturb events, die-to-die variations, block-to-block variations, page-to-page variations, and the like. In any case, the worst-case RBER for the end-of-life of a memory device may be extremely high (e.g., 100-1000 times worse than the average RBER during the initial P/E cycle period) as compared to the average RBER during the initial life of the memory device.

Although the graph 40 indicates the number of P/E cycles performed by the memory device is associated with the RBER value for the memory device, it should be understood that the graph 40 is provided for illustrative purposes and is not meant to limit the scope of the techniques described herein. Moreover, it should be noted that the RBER values for a respective memory device may depend on the size of the memory cells contained therein, the type of memory cell used by the memory device, ambient conditions associated with the use of the memory device, in addition to the number of P/E cycles performed by the memory device.

Keeping the foregoing in mind, it is clear that the majority of errors may be detected and corrected during the initial P/E cycle period 42 using a less powerful ECC as compared to the errors that occur during the mid-level P/E cycle period 44 or the high-level P/E cycle period 46. That is, although a memory device may use just one powerful ECC over the life of a memory device to ensure that the errors in the initial, mid-level, and high level P/E cycle periods are detected and corrected, the memory device may not be efficiently consuming power with regard to its decoding operations by employing just one powerful ECC. With a single powerful ECC, the energy per corrected bit will be relatively high, as compared to using various ECC modes as will be detailed below.

Since the majority of the errors of a memory device occur near the average RBER value during the initial P/E cycle period, the memory device may detect and correct these errors using a less powerful ECC as compared to an ECC used to detect and correct errors in the mid-level or high-level P/E cycle period. In this manner, the memory device may save power by using an ECC algorithm that consumes less processing power to detect and correct errors for most of the life of the memory device or during the initial P/E cycle period 42. As such, by using a less powerful ECC mode in the initial P/E cycle period, battery life of the memory device improves. In order to be able to employ different ECC modes at different P/E cycle periods, the memory device may be capable of encoding user data (i.e., generate parity bits) for the different ECC codes used in various modes.

Moreover, powerful ECCs, such as low density parity check (LDPC) codes, may use soft data or information to correct a high number of bit errors. Soft data may include reliability information regarding the value received via a hard input. For example, a processor may receive a hard input of a value 0 and soft data associated with the hard input indicating that the probability that the hard input value of 0 being correct is 90%.

By employing the soft data to correct errors in the codeword, the memory device becomes even less efficient in terms of throughput since accessing soft data from memory components involves making multiple reads (i.e., accessing memory components), which translates into slower read times compared to when performing a hard read. Further, transferring the soft information from the memory component through an Open NAND Flash Interface (ONFI) generally includes a high throughput penalty, as multiple bits are transferred as compared to a single bit provided in the hard read case. Additionally, using the soft data involves determining and calculating soft read positions to serve all of the pages, blocks, or dies in the memory device may prove to be a difficult task that involves a significant amount of processing power. Given these issues regarding the use of soft data, it may be beneficial to limit the use of soft data until the memory device is operating in the mid-level or high-level P/E cycle periods (i.e., when the codeword is not correctable using hard data).

With this in mind, the graph 40 of FIG. 3 clearly indicates that for a significant number of the P/E cycles (i.e., during the initial P/E cycle period 42), the RBER generally remains flat or increases slowly. As such, in certain embodiments, the error correction during this period may be handled using a relatively simple and power efficient ECC mode as compared to other ECC modes used during other periods discussed below. As the RBER values deviate from the average RBER during the initial P/E cycle period 42, the memory device may employ an ECC mode that may consume more power than the ECC mode used during the initial P/E cycle period. However, since a large majority of the life of the memory device is in the initial P/E cycle period 42, the use of the higher power ECC modes may be limited over the life of the memory device to close to end-of-life P/E cycle points and deviations from average RBER. As such, as the P/E cycles increase and the corresponding slope of the RBER vs. P/E cycles curve for a respective memory device increases, the memory device may progressively change the ECC decode algorithm (or mode) used to correct errors. As a result, the overall amount of energy (e.g., pJ/bit, i.e., energy for each corrected bit error) for the memory device decreases, thereby creating energy savings for the memory device leading to extended battery life.

To progressively change the ECC algorithm (i.e., decode mode) used to detect and correct the errors, a processor (e.g., memory SoC 22) may seamlessly transition between ECC decode modes according to the RBER values for a respective memory device without using any more ECC effort than what is sufficient to correct the errors for the corresponding data having some RBER value and having performed some number of P/E cycles. Moreover, the processor may perform the transition between ECC algorithms without adding any latency issues to the rest of the memory device to ensure that the memory device operates consistently.

Figure 4:
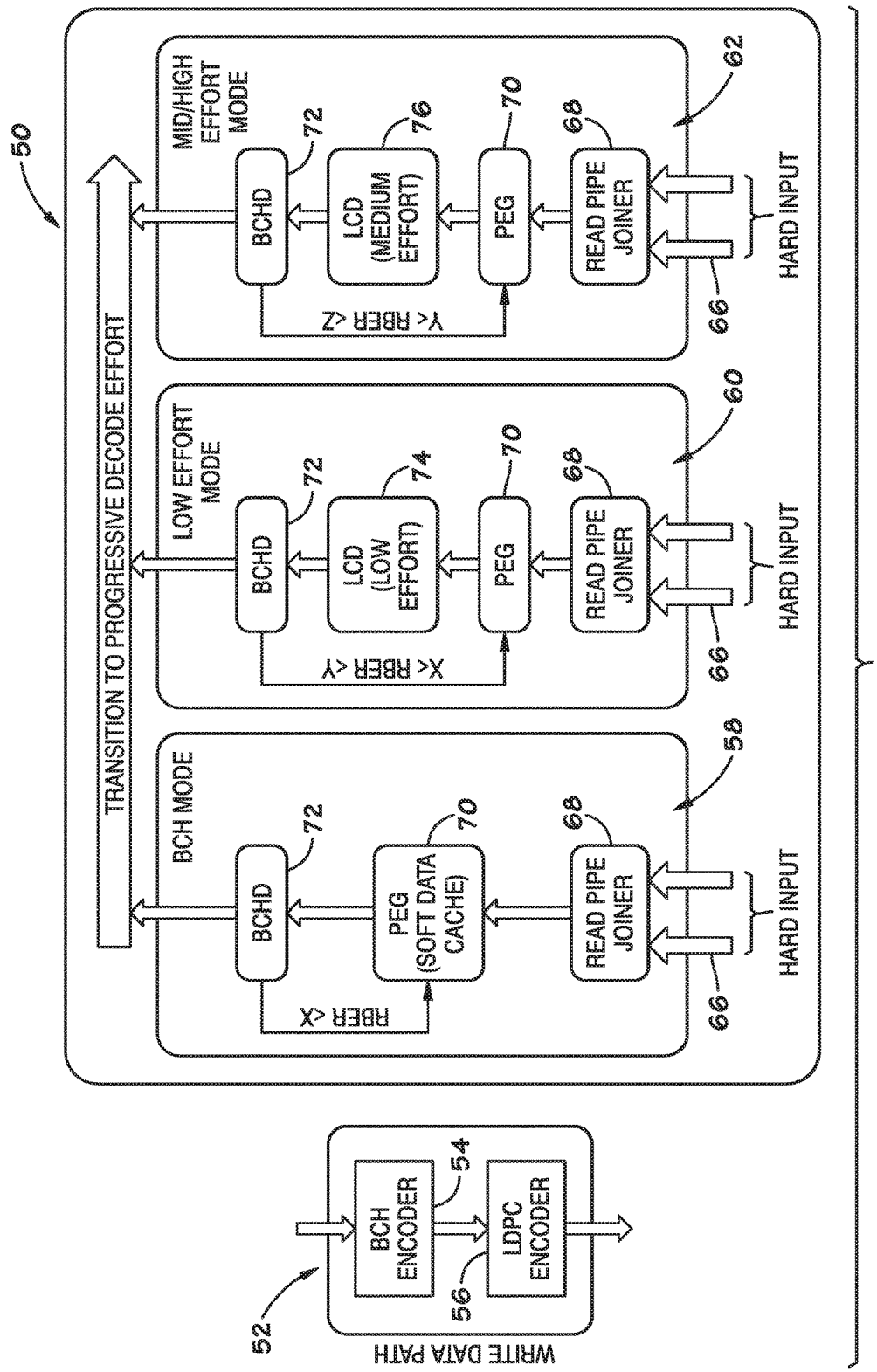
FIG. 4 illustrates a block diagram of a progressive effort guide (PEG) decoder architecture for decoding codewords of memory devices using varying levels of Error Correction Code (ECC) decode algorithms (i.e., modes), in accordance with an embodiment.

In one embodiment, to progressively change the ECC algorithm used by a processor that corrects errors, the processor may implement a progressive effort guide (PEG) decoder architecture 50, as illustrated in FIG. 4. The PEG decoder architecture 50 may guide the processor to seamlessly transition between various types of ECC algorithms to minimize the amount of energy consumed during the decoding or error correction process. As shown in FIG. 4, the PEG decoder architecture 50 may include a number of components that may be implemented using hardware components within the processor, using software components executed by the processor, or various combinations of both.

Although the PEG decoder architecture 50 is described below using certain ECC algorithms, it should be understood that the ECC algorithms presented below are example ECC algorithms that may be implemented in the PEG decoder architecture 50. That is, the processor of the memory device may employ any type of ECC algorithm and the techniques described herein are not limited to the ECC algorithms mentioned below.

Referring now to FIG. 4, when writing data to a memory component, in certain embodiments, the processor may encode the data according to a write data path 52. That is, the processor may use, for example, a BCH encoder 54 and/or a low density parity check (LDPC) encoder 56 to encode the data (i.e., compute parity bits) to generate a codeword.

Upon reading the written data, the processor may employ the PEG decoder architecture 50 to progressively decode the codeword of the written data according to a BCH mode 58, a low-effort mode 60, or a mid/high effort mode 62 both of which involve BCH and LDPC decoders. Generally, the processor may read the hard data via channels 66 and attempt to decode or correct errors in the codeword using a BCH decoder (BCHD) alone in the BCH mode 58. That is, the processor may directly access a memory location to read the codeword and then use the BCH decoder to independently decode the codeword read via the channels 66. If the processor receives an indication that the BCHD may not be capable of correcting all of the errors of the respective codeword independently, the processor may proceed to the low-effort mode 60 and attempt to decode the codeword using a low-effort decoder (e.g., low-effort LDPC decoder (LCD)) in combination with the BCHD. Again, if the processor receives an indication that the BCHD in combination with the low-effort LDPC decoder may not be capable of correcting all of the errors of the respective codeword, the processor may proceed to the mid/high effort mode 62 and attempt to decode the codeword using a medium-effort decoder (e.g., medium-effort LDPC decoder (LCD)) in combination with the BCHD, which may be capable of detecting and correcting errors in data having high RBER values as experienced in end-of-life periods of a memory device. By following the general process described above, the processor enables the memory device to efficiently decode codewords without unnecessarily using high energy-consuming ECC algorithms when errors in a respective codeword may be corrected using ECC algorithms that consume less energy.

Referring back to FIG. 4, when initially reading the codeword via the channels 66, the processor may employ a read pipe joiner component 68 to receive the channels 66 as shown in BCH mode block 58. The read pipe joiner component 68 may be a hardware component or a software component that may facilitate the sharing of a single downstream read pipe between two upstream ONFI channels. As such, the read pipe joiner component 68 may process data at a rate of two times the ONFI speed of one ONFI channel. In this way, the read pipe joiner component 68 may handle peak data-rates from two channels without inducing a stall on either channel. Moreover, the read pipe joiner component 68 provides packet-level buffering, such that the data or codeword received via the channels 66 may be forwarded to a progressive effort guide (PEG) component 70. Although FIG. 4 illustrates using a read pipe joiner component to receive the data via the channels 66, it should be noted that any other suitable receiving component may be used instead of the read pipe joiner component and that the read pipe joiner component is used herein as a non-limiting example type of receiving component. Furthermore, read pipe joiner or receiving component may be configured to receive the data from more than two channels.

Like the read pipe joiner component 68, the PEG component 70 may be implemented as a hardware component or a software component. In one embodiment, the PEG component 70 may include a cache that may store the codeword received via the read pipe joiner component 68. Generally, the PEG component 70 may orchestrate or implement the progressive decode effort described above based on feedback regarding the decoding of the received codeword. Initially, the PEG component 70 may send the codeword to a BCH decoder (BCHD) component 72 (i.e., hardware or software component), which may apply a BCH decoding algorithm to the codeword to determine whether the codeword includes any errors. In one embodiment, the BCHD component 72 may provide the most power efficient (i.e., least power consuming) ECC algorithm as compared to the ECC algorithms implemented in the low-effort mode 60, and the mid/high effort mode 62. Although the BCHD component 72 provides the most power efficient ECC code as compared to the others provided in the PEG decoder architecture 50, the BCHD component 72 may provide the least amount of ECC capabilities as compared to the others in terms of the number of bits that can be corrected given a fixed ECC parity overhead. While PEG decoder architecture transition from BCH mode to low-effort mode and to mid/high-effort mode, the codeword stored in a memory of the PEG component 70 is continuously used for each mode. That is, the respective decoding component may not perform a read of the codeword for each decode effort mode. Instead, the read pipe joiner component 68 may make a single hard read and use the same hard data through different decoding modes. As such, the transition between each decoding mode occurs smoothly or without causing much lag in the operation of the memory device. In this way, the memory device may then avoid performing multiple hard reads unless, for example, a failure occurs with the hard data. In this case, the memory device may then acquire soft data from flash.

When decoding the codeword, in one embodiment, the BCHD component 72 may make an early determination as to whether the codeword has a number of errors beyond its own correction capability using a Berlekamp algorithm. Based on the results of the Berlekamp algorithm, the BCHD component 72 may abort the decoding of the codeword.

With the foregoing in mind, if the BCHD component 72 determines that the codeword does not have errors beyond the capabilities of the BCHD component 72 alone, the BCHD component 72 may decode the codeword, identify any errors in the codeword, correct the errors, and/or verify that the data being read is error-free. Generally, if the memory device providing the codeword is operating in the initial P/E cycle period 42, where the average RBER value is less than the low value X, the BCHD component 72 will likely be capable of detecting and correcting the errors associated with the received codeword. As such, the BCHD component 72 may be designed to correct errors having an average RBER value that is less than the low value X (e.g., 3e-4 to 6e-4).

If, however, the BCHD component 72 determines that the codeword has errors beyond the capabilities of the BCHD component 72 by itself, the BCHD component 72 may send a status update or message to the PEG component 70 indicating the status of the decoding process (i.e., BCHD will be unable to correct the errors). In one embodiment, the BCHD component 72 may provide this feedback to the PEG component 70 via a Progressive Side-band Information (PSI) component of the BCHD component 72.

In addition to storing information related to the decoding process, the PEG component 70 may use the cache to buffer hard codewords received via the channels 66, to support out-of-order delivery of codewords, and the like. In response to receiving a status update indicating that the BCHD component 72 may not be capable of decoding the codeword, the PEG component 70 may attempt to decode the codeword using the low-effort mode 60. To orchestrate a seamless transition between various decode modes, the PEG component 70 may forward the codeword, which is stored in a memory associated with the PEG component 70, to a low-effort low density parity check decoder (LCD) component 74 of the low-effort mode 60.

As mentioned above, the LDPC codes are quite powerful in terms of their error correction capabilities. However, in certain embodiments, the LDPC decoders may be implemented, such that the LDPC decoders may deliver varying degrees of power. With this in mind, the low-effort LCD component 74 may include a power efficient LDPC decoder that is less powerful in terms of error correction as compared to other versions of the LDPC decoder that will be described below, but more power efficient in terms of the energy it consumes when performing the error correction. In certain embodiments, the low-effort LCD component 74 may not operate more than some number (e.g., 2) of iterations. As such, the low-effort LCD component 74 may not have a high level of internal decoder precision.

In the low-effort mode 60, the low-effort LCD component 74 and the BCHD component 72 may both be used to decode the codeword. In this way, the low-effort mode 60 may provide improved or more powerful ECC abilities as compared to the BCH mode 58 but may consume more energy as compared to the BCH mode 58, which uses just the BCHD component 72. In certain embodiments, as performed in the BCH mode 58, the BCHD component 72 may determine whether the codeword, after being error-corrected by the low-effort LCD component 74, includes remaining errors beyond the capabilities of the BCHD component 72. If the BCHD component 72 determines that the remaining errors of the codeword are capable of being corrected by the BCHD component 72 (e.g., using the Berlekamp algorithm), the BCHD component 72 may correct the remaining errors in the codeword. By way of example, the memory device using the low-effort LCD component 74 may be operating in the mid-level P/E cycle period 44, where the average RBER value is greater than the low value X (e.g., 3e-4 to 6e-4) but less than the mid value Y (8e-4 to 2e-3).

If, however, the BCHD component 72 determines that the partially corrected codeword still has errors beyond the capabilities of the BCHD component 72, the BCHD component 72 may send data related to the ECC analysis performed on the codeword by the BCHD component 72 and the low-effort LCD component 74 and/or a status update or message to the PEG component 70 indicating the status of the decoding process.

In response to receiving a status update, the PEG component 70 may send the codeword, which may be stored in the memory associated with the PEG component 70, to the mid/high effort mode 62. The mid/high effort mode 62 includes the PEG component 70, the BCHD component 72, and a medium-effort LCD component 76. Generally, the mid/high effort mode 62 may be used to perform two tiers of decoding processes. The first of the two tiers of decoding may include using the medium-effort LCD component 76 and the BCHD component 72. Like the low-effort mode 60, the medium-effort LCD component 76 and the BCHD component 72 may both be used to decode the codeword. In this way, the medium-effort mode 60 may provide improved or more powerful ECC code abilities but may use additional power as compared to the low-effort mode 60. In certain embodiments, the medium-effort LCD component 76 may perform a higher number (e.g., 2 or more) of decoder iterations to identify and correct the errors in the codeword as compared to the low-effort LCD component 74 of the low-effort mode 58. After correcting the errors of the codeword using the medium-effort LCD component 74, the BCHD component 72 may determine whether the resulting codeword is decodable by the BCHD component 72. If the BCHD component 72 determines that the codeword is capable of being decoded, the BCHD component 72 may decode the resulting codeword, identify any errors in the resulting codeword, correct the identified errors in the resulting codeword, and verify that the codeword is then error-free. Here, the memory device providing the codeword may be operating in the high-level P/E cycle period 46, where the average RBER value is greater than the mid value Y (e.g., 8e-4 to 2e-3) but less than the high value Z (e.g., 3e-3 to 5e-3).

If, however, the BCHD component 72 determines that the error-corrected codeword still has errors beyond the capabilities of the BCHD component 72, the BCHD component 72 may send data related to the ECC analysis performed on the codeword by the BCHD component 72 and the medium-effort LCD component 74 and a status update or message to the PEG component 70 indicating the status of the decoding process.

In response to receiving a status update indicating that the BCHD component 72 may not be capable of decoding the codeword, the PEG component 70 may use the mid/high effort mode 62 again to decode the codeword. However, unlike the previous decoding process, the PEG component 70 may use soft data to perform the decoding process with the medium-effort LCD component 76. Soft data at this stage should be requested from flash and stored in PEG memory. As mentioned above, the soft data may include reliability information regarding the data received via the hard input. By using the soft data with the medium-effort LCD component 76 and the BCHD component 72, the memory device is using a decoding process that is more powerful than the previously described processes. In fact, using the soft data enables the medium-effort LCD component 76 to approach its maximum correction capability. However, given that soft data is used in the decoding process, the throughput or speed at which the decoding is performed may be the slowest as compared to the other processes (e.g., up to 5 to 6 times slower than the previous decoding effort). Moreover, although this decoding process is capable of correcting more errors than the other processes, it should be understood that decoding using the soft data will consume more energy than the processes described above since it involves more complex processing, additional accesses to memory components, and the like.

In addition to the mid/high effort mode 62 employing soft data to correct errors identified in codewords, it should be noted that, in various embodiments, the PEG component 70 may use available soft data regarding the codeword in any of the modes discussed above. For instance, the memory of the PEG component 70 may store a mix of hard and soft data with different resolutions (i.e., 2-bit, 3-3 bit, 4-bit etc soft information). Furthermore, the PEG component 70 may service more than one instance of two different decoders (e.g., BCHD and LDPC decoders). Additionally, the PEG component 70 may also concurrently drive multiple decode modes with hard and soft data.

Furthermore, the PEG component 70 may also receive information regarding an input error rate associated with the codeword via a flash memory. The input error rate may correspond to a likelihood of an error being present based on a location of the flash memory from which the codeword is received. That is, certain locations within the flash memory may be used more often than other areas of the flash memory. Using this information, the PEG component 70 may bypass certain decoding modes if it determines that the bypassed decoding modes will not be capable of decoding and correcting the errors in the codeword.

In any case, although the PEG decoder architecture 50 described above illustrates various modes of decoding processes that include various types of decoder techniques or algorithms, it should be understood that for the vast majority of the life of the memory device, the errors will be identified and corrected using the BCH mode 58. As such, the memory device may predominantly use an energy efficient decoder, such as the BCHD component 72, thereby significantly reducing the energy consumed by the memory device over its lifetime.

Figure 5:
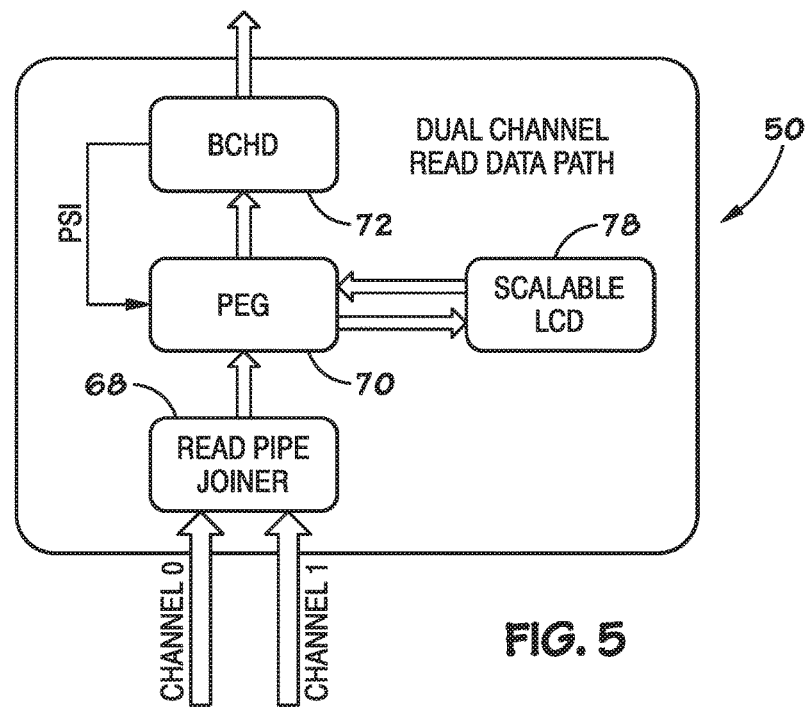
FIG. 5 illustrates a block diagram of a simplified view of the PEG decoder architecture of FIG. 4, in accordance with an embodiment.

Keeping the discussion related to FIG. 4 in mind, FIG. 5 illustrates a simplified block diagram of the PEG decoder architecture of FIG. 4. As shown in FIG. 5, the PEG decoder architecture 50 may include receiving data by the read pipe joiner component 68 via the channels 66. As such, the PEG decoder architecture 50 may deliver codewords within a channel in order or out of order between two channels. In either case, the PEG component 70 may be used to organize the received codewords, such that it may be processed by the appropriate ECC code.

Moreover, as shown in FIG. 5, the PEG component 70 may receive data from the BCHD component 72 and determine whether to increase the level of decoding used for the respective codewords using a scalable LCD component 78. The scalable LCD component 78 may deliver or perform the low-effort mode 60 or the mid/high effort mode 62 described above. In addition, the scalable LCD component 78 adjust a decoder precision and/or a number of decoder iterations performed by the BCH decode mode, the low-effort LDPC decode mode, and the medium-effort decode mode. In any case, the PEG component 70 may enable the memory device to improve the efficiency in which errors are detected while maintaining the ability to correct a large number of errors.

In certain embodiments, the PEG component 70 may service more than one instance of the ECC modes described above. That is, the PEG component 70 may receive multiple codewords via the channels 66 and may simultaneously use different ECC modes to correct the errors of the respective codewords. For instance, the PEG component 70 may service one codeword using the low-effort mode 60 and the corresponding BCHD component 72 while simultaneously servicing another codeword using the mid/high effort mode 62 and the corresponding LDPC component. Moreover, the PEG component 70 may also schedule or coordinate the multiple servicing of the different codewords based on details regarding the respective codeword, the availability of a particular decoder component, and the like.

Additionally, the PEG decoder architecture 50 may work with a particular RBER distribution by adjusting ECC code rates of the BCH and LDPC codes employed by the BCHD component 72 and the LCD component, respectively. For instance if the average RBER for a given technology node is low, it would be possible to use higher ECC overhead for the BCH code. In contrast, if the worst case RBER is relatively high as compared to other memory technologies, then the LDPC code overhead may be increased to be able to correct these errors. As such, the code selection may be done before the memory device starts operation or on the fly (i.e., while the memory device is in use). Furthermore, it should be noted that the adjustment of ECC code rates does not change the hardware implementation of PEG decoder architecture 50.

Figure 6:
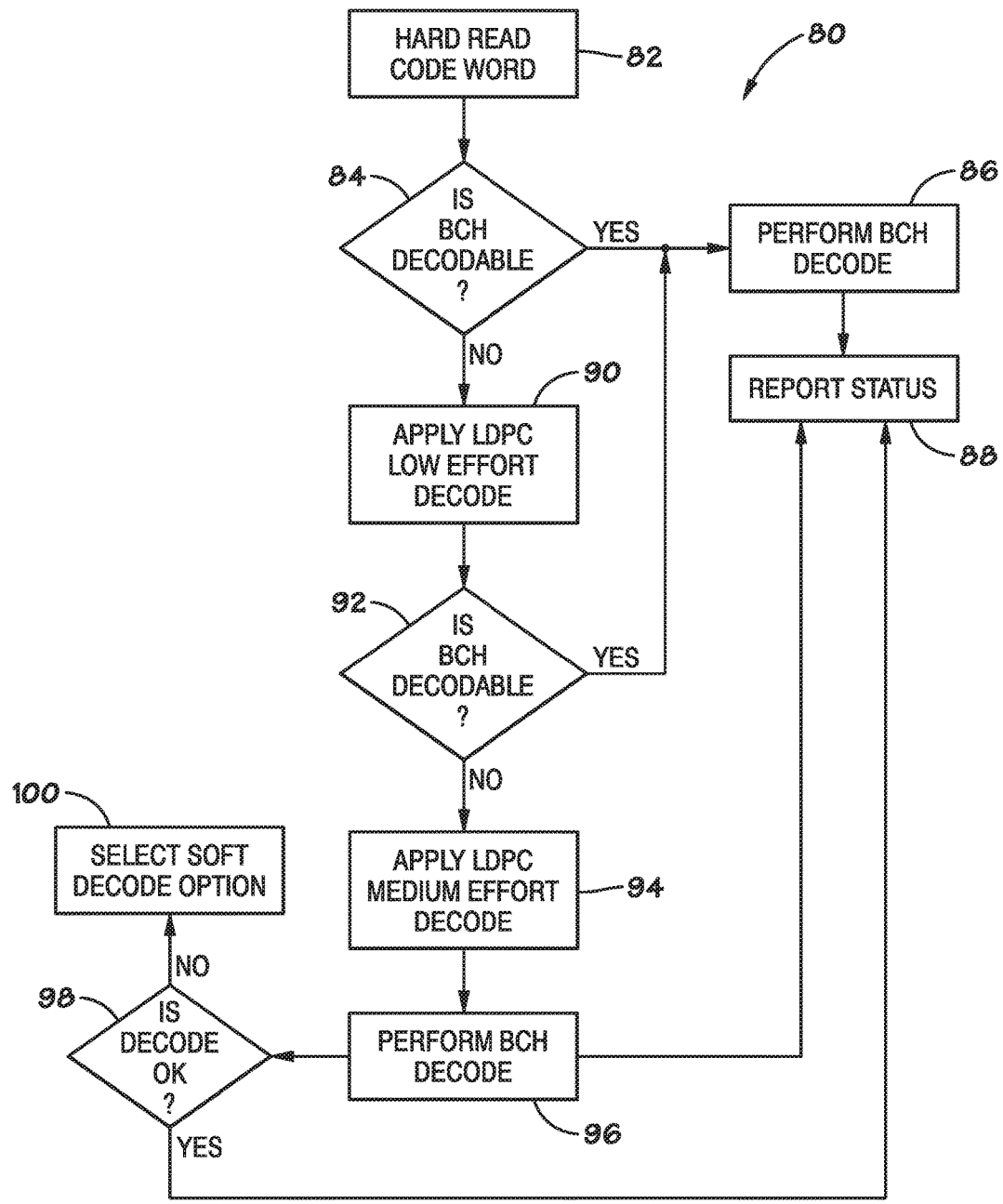
FIG. 6 illustrates a flow chart of a method for using the PEG decoder architecture of FIGS. 4 and 5, in accordance with an embodiment.

With the foregoing in mind, FIG. 6 illustrates a flowchart of a method 80 for efficiently decoding data written in a memory device according to the PEG decoder architecture 50 of FIG. 4. In certain embodiments, a processor, such as the memory SoC 22, may perform the method 80 within the PEG component 70 described above.

At block 82, the controller may directly access the codeword from a memory address (i.e., perform a hard read of the codeword), such that the codeword may be analyzed for errors. As mentioned above, the processor may perform a hard read of the codeword via the read pipe joiner component 68, which may be implemented as a software or hardware component. Upon initially receiving the codeword, the processor may forward the codeword to the BCHD component 72, which may perform some analysis on the codeword to determine if the codeword has errors beyond its correction capability. That is, at block 84, the processor may receive an indication as to whether the codeword is independently decodable by the BCHD component 72 alone. In one embodiment, this indication may be received via a Progressive Side-band Information (PSI) component from BCHD component 72. If the codeword is decodable, the BCHD component 72 may decode the codeword using the BCH code. After decoding the codeword, the processor may proceed to block 88 and report a status of the correctly decoded codeword. As such, the processor may store a status regarding the BCH decoding of the codeword in a soft data cache or the like.

If, however, at block 84, the processor receives an indication that the codeword is not BCH decodable using just the BCHD component 72, the processor may proceed to block 90 and apply a low-effort LDPC decode mode to the codeword. Here, the processor may employ the low-effort LCD component 74 as well as the BCHD component 72 to decode the codeword. That is, the low-effort LCD component 74 may correct a portion of the errors in the codeword using the low-effort LDPC decode mode (algorithm) and correct the remaining errors of the codeword using the BCHD component 72. Upon receiving the error-corrected (or partially error-corrected) codeword, the BCHD component 72 may then determine whether the remaining portion of the codeword is BCH decodable or correctable (i.e., errors could be corrected by the BCHD component 72).

At block 92, if the remaining portion of the codeword is indeed decodable, the processor may return to block 86 described above. If, however, the remaining portion of the codeword is not BCH decodable, the processor may proceed to block 94. At block 94, the processor may employ the medium-effort LCD component 76 to perform a medium-effort LDPC decode mode, which may perform additional LDPC decoder iterations (e.g., 2 or more) compared to the low-effort LDPC decode mode. In certain embodiments, the low-effort LDPC decode mode and the medium-effort LDPC decoder mode may be characterized according to a number of decoding iterations as well as the internal precisions that each respective decode mode may employ.

After applying the medium effort LDPC decode mode, the processor may proceed to block 96 and use the BCHD component 72 to decode the resulting codeword using the BCH code. After decoding the codeword, at block 98, the processor may determine whether the codeword has been decoded correctly (i.e., the decoded codeword is error free). If the processor determines that the codeword has been decoded correctly, the processor may proceed to block 88 and report the status of the decoding process.

If, however, at block 98, the processor determines that the codeword has not been decoded correctly, the processor may proceed to block 100 and apply the medium-effort LDPC decode mode again using a soft decode option. That is, the processor may apply the medium-effort LDPC decode mode again using soft data related to the reliability of the data received via the hard input. By using this soft data along with the medium-effort LDPC decode mode, the processor may approach its maximum correction capability. Moreover, as discussed above, since the majority of the codewords received by the processor may be decodable using the BCH code at block 86, the processor may use energy for decoding purposes efficiently. That is, the processor may not use high power ECC algorithm to decode codewords when it is likely that the codewords may be decoded using a lower power ECC decode mode (e.g., BCH decoder).

While the presently disclosed systems and techniques may be susceptible to various modifications and alternative forms, specific embodiments have been shown by way of example in the drawings and have been described in detail herein. However, it should be understood that the disclosed systems and techniques are not intended to be limited to the particular forms disclosed. Rather, the disclosed systems and techniques are provided to cover all modifications, equivalents, and alternatives falling within the spirit and scope of the invention as defined by the following appended claims.

What is claimed is:

1. A method, comprising:
   receiving, via a processor, a codeword configured to indicate whether data associated with the codeword includes one or more errors;
   determining whether the codeword is decodable using a first error correction code (ECC) algorithm;
   decoding the codeword using the first ECC algorithm when the codeword is determined to be decodable by the first ECC algorithm; and
   decoding a portion of the codeword using a second ECC algorithm and decoding a remaining portion of the codeword using the first ECC algorithm in response to the first ECC algorithm being unable to solely decode the codeword.

2. The method of claim 1, wherein the codeword is decodable by the first ECC algorithm when the data is written into a memory during an initial-life of the memory.

3. The method of claim 1, wherein the codeword is not decodable by the first ECC algorithm after the initial-life of the memory.

4. The method of claim 1, wherein decoding the portion of the codeword using the second ECC algorithm and decoding the remaining portion of the codeword using the first ECC algorithm comprises:

decoding the portion of the codeword at least partially using the second ECC algorithm after an initial life of the memory, thereby generating a partially decoded codeword;

determining whether the partially decoded codeword is decodable using the first ECC algorithm;

decoding the remaining portion of the codeword using the first ECC algorithm when the partially decoded codeword is determined to be decodable by the first ECC algorithm.

5. The method of claim 1, comprising storing soft data associated with the decoding of the codeword in a cache.

6. The method of claim 1, wherein the codeword is received by directly accessing one or more memory cells of the memory via a hard read.

7. The method of claim 6, wherein the hard read comprises multiple channels.

8. A memory device, comprising;
one or more memory components configured to store data;
a processor configured to decode a codeword associated with the data, wherein the processor is configured to:
receive the codeword;
decode the codeword using a BCH decoder during an initial life of the one or more memory components; and
decode a portion of the codeword using a second decoder and decode a remaining portion of the codeword using the BCH decoder after the initial life of the one or more memory components.

9. The memory device of claim 8, wherein the one or more memory components comprise one or more NAND memory cells.

10. The memory device of claim 8, wherein the one or more memory components are configured to employ at least one program/erase cycle when writing the data.

11. The memory device of claim 8, wherein the second decoder corresponds to a low density parity check (LDPC) code.

12. The memory device of claim 8, wherein the second decoder is configured to consume more energy as compared to the BCH decoder.

13. The memory device of claim 8, wherein the second decoder is configured to perform more than one iteration.

14. The memory device of claim 8, wherein the processor is configured to decode the codeword using the BCH decoder based on a determination of whether the codeword is decodable using the BCH decoder using a Berlekamp algorithm.

15. The memory device of claim 14 wherein the BCH decoder is configured to send a status update regarding whether the codeword is decodable using the BCH decoder to a cache.

16. The memory device of claim 15, wherein the BCH decoder is configured to send the status update via a Progressive Side-band Information (PSI) component.

17. A tangible, non-transitory, machine-readable medium, comprising instructions configured to:
receive a codeword configured to indicate whether data associated with the codeword includes one or more errors, wherein the codeword is received from a memory;
decode the codeword using the BCH decoder during an initial number of write operations performed on the memory; and
decode a first portion of the codeword using a first low density parity check (LDPC) decoder and a first remaining portion of the codeword using the BCH decoder or decode a second portion of the codeword using a second LDPC decoder and a second remaining portion of the codeword using the BCH decoder after the initial number of write operations are performed on the memory.

18. The tangible, non-transitory, machine-readable medium of claim 17, wherein the instructions are configured to decode the first remaining portion of the codeword using the BCH decoder and the first portion of the codeword using the first LDPC decoder after determining that the codeword is not decodable using the BCH decoder alone.

19. The tangible, non-transitory, machine-readable medium of claim 17, wherein the instructions are configured to decode the second remaining portion of the codeword using the BCH decoder and the second portion of the codeword using the second LDPC decoder after determining that the codeword is not decodable using the BCH decoder and the first LDPC decoder.

20. The tangible, non-transitory, machine-readable medium of claim 19, wherein the instructions are configured to decode the second remaining portion of the codeword using the BCH decoder and the second portion of the codeword using the second LDPC decoder and soft data regarding a reliability of each bit in the codeword when the second remaining portion of the codeword is not decodable by the BCH decoder and the second portion of the codeword is not decodable by the second LDPC decoder.

* * * * *